United States Patent
Zhou et al.

(10) Patent No.: US 7,791,399 B2
(45) Date of Patent: Sep. 7, 2010

(54) OVER-VOLTAGE PROTECTION CIRCUIT AND LCD DRIVING CIRCUIT USING THE SAME

(75) Inventors: He-Kang Zhou, Shenzhen (CN); Tong Zhou, Shenzhen (CN)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 0 days.

(21) Appl. No.: 12/386,606

(22) Filed: Apr. 20, 2009

(65) Prior Publication Data

US 2009/0261894 A1    Oct. 22, 2009

(30) Foreign Application Priority Data

Apr. 18, 2008    (CN) .................... 2008 1 0066746

(51) Int. Cl.
    *G05F 1/10*    (2006.01)
(52) U.S. Cl. .................... 327/340; 327/309; 327/541

(58) Field of Classification Search ............... 327/306, 327/309–321, 538–544; 323/313–316
See application file for complete search history.

(56) References Cited

U.S. PATENT DOCUMENTS

| | | | |
|---|---|---|---|
| 3,048,718 A * | 8/1962 | Starzec et al. | 361/91.6 |
| 5,424,673 A * | 6/1995 | Edwards et al. | 327/530 |
| 6,061,445 A | 5/2000 | Rahamim et al. | |
| 2004/0095815 A1 | 5/2004 | Chloupek et al. | |

* cited by examiner

*Primary Examiner*—Dinh T. Le
(74) *Attorney, Agent, or Firm*—Wei Te Chung

(57) ABSTRACT

An LCD driving circuit comprising an over-voltage protection circuit includes an input terminal to receive an input voltage, a voltage-dividing circuit, a voltage-stabilizing circuit including a voltage-stabilizing element, a control circuit, a switching element, and an output terminal. The voltage-dividing circuit provides a reference voltage according to the input voltage to the voltage-stabilizing circuit, the voltage-stabilizing circuit determines whether the voltage-stabilizing element conducts according to the reference voltage, and the control circuit controls the switching element to switch on or off according to a working stage of the voltage-stabilizing element to determine whether the output terminal outputs an output voltage.

19 Claims, 2 Drawing Sheets

OVER-VOLTAGE PROTECTION CIRCUIT AND LCD DRIVING CIRCUIT USING THE SAME

BACKGROUND

1. Technical Field

The present disclosure relates to an over-voltage protection circuit and a driving circuit of a liquid crystal display (LCD) device using the same.

2. Description of Related Art

Because LCD devices have the advantages of portability, low power consumption, and low radiation, they are widely used in various portable information products such as notebooks, personal digital assistants (PDAs), video cameras, and others. An LCD device usually needs a power board circuit providing power thereto.

The power board circuit is usually connected to an external main power supply, and receives power output from the external main power supply. Therefore, when the external main power supply is unstable or the power board circuit is disturbed by circuit variation or other interference, the power board circuit is liable to output a voltage exceeding an acceptable voltage range of the LCD device, and the LCD device is at the risk of severe damage. Other elements connected to the power board circuit may also be affected.

What is needed, therefore, is an over-voltage protection circuit and an LCD driving circuit which can overcome the described limitations.

DETAILED DESCRIPTION

Reference will now be made to the drawings to describe the disclosure in detail.

Figure 1:
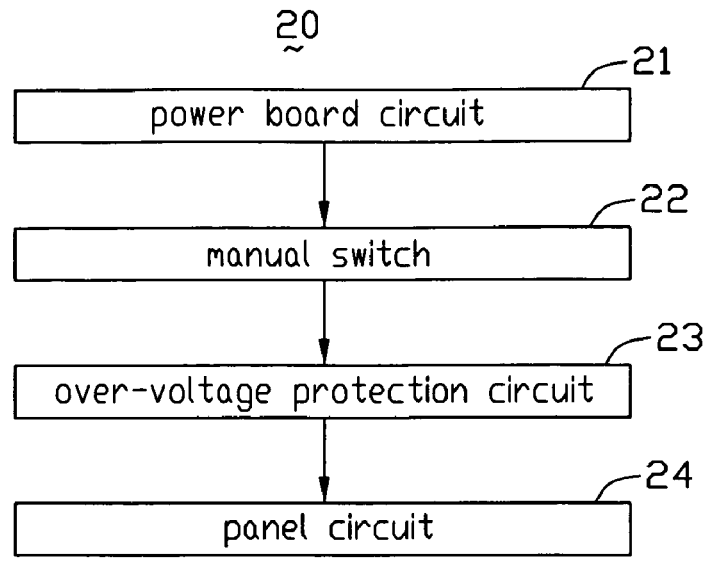
FIG. 1 is a block diagram of an LCD driving circuit according to the present disclosure, the driving circuit including an over-voltage protection circuit.

FIG. 1 is a block diagram of an LCD driving circuit 20 comprising an over-voltage protection circuit 23 according to the present disclosure. The driving circuit 20 further comprises a power board circuit 21, a manual switch 22, and a panel circuit 24. The power board circuit 21 receives alternate current (AC) voltage provided by an external main power supply (not shown) and converts the AC voltage to direct current (DC) voltage of approximately 5V, in one example. Upon activation of the manual switch 22, the 5V DC voltage is output from the power board circuit 21 to the panel circuit 24 via the manual switch 22 and the over-voltage protection circuit 23. The panel circuit 24 converts the 5V DC voltage into various driving signals to drive a liquid crystal panel (not shown) for displaying images. When the manual switch 22 is deactivated, electrical connection between the power board circuit 21 and the panel circuit 24 is cut off and a liquid crystal panel powers down.

The over-voltage protection circuit 23 is connected between the manual switch 22 and the display circuit 24. When a voltage output from the power board circuit 21 is less than a predetermined value such as 5.5V, the over-voltage protection circuit 23 electrically connects the power board circuit 21 and the panel circuit 24. When voltage output from the power board circuit 21 exceeds or equals the predetermined value, the over-voltage protection circuit 23 automatically cuts off an electrical connection between the power board circuit 21 and the panel circuit 24.

Figure 2:
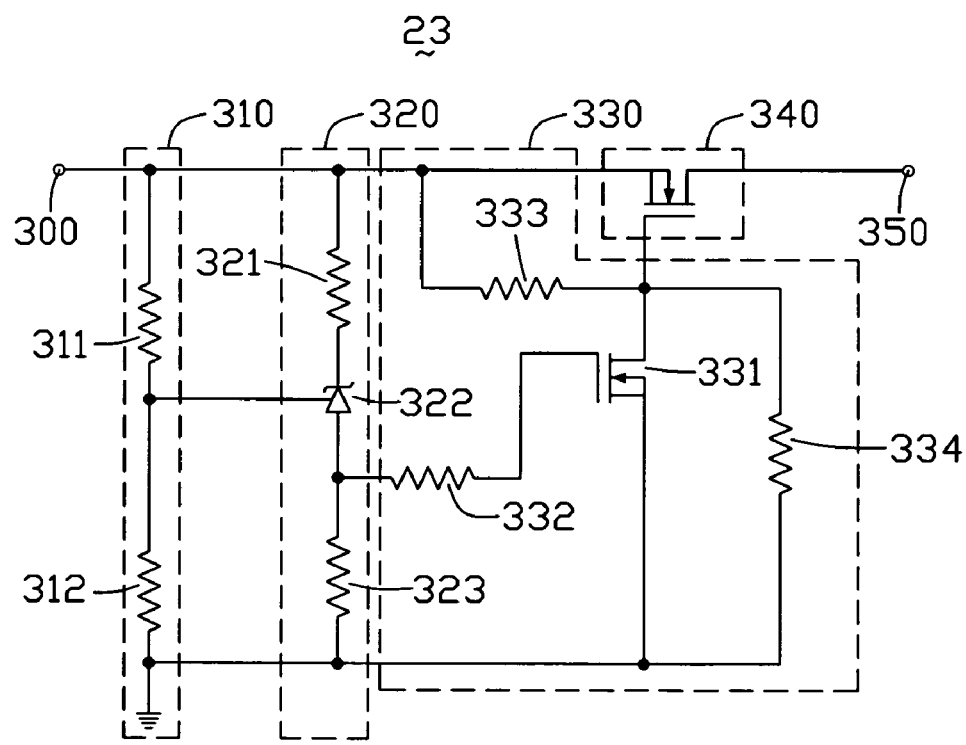
FIG. 2 is a circuit diagram of the over-voltage protection circuit of FIG. 1.

Referring to FIG. 2, the over-voltage protection circuit 23 includes an input terminal 300, an output terminal 350, a voltage-dividing circuit 310, a voltage-stabilizing circuit 320, a control circuit 330, and a first transistor 340 as a switching element.

The voltage-dividing circuit 310 provides a reference voltage to the voltage-stabilizing circuit 320, and includes two resistors 311, 312 connected in series between the input terminal 300 and ground. A proportion of resistances of the two resistors 311, 312 is 6:5, in one example. For example, when a voltage received by the input terminal 300 is 5.5V, a dividing voltage on the resistor 312 is 2.5V.

The voltage-stabilizing circuit 320 includes a voltage-stabilizing element 322 and two resistors 321, 323. The voltage-stabilizing element 322 may be an adjustable shunting voltage regulator having a type of TLV431, and includes an anode (not labeled), a cathode (not labeled), and a reference terminal (not labeled). A conducting voltage of the voltage-stabilizing element 322 is about 2.5V, namely, the voltage-stabilizing element 322 conducts when the reference voltage provided by the voltage-dividing circuit 310 to the reference terminal exceeds or equals about 2.5V. Accordingly, the voltage-stabilizing element 322 does not conduct when the reference voltage provided by the voltage-dividing circuit 310 is less than about 2.5V. The reference terminal of the voltage-stabilizing element 322 is connected between the two resistors 311, 312, the cathode is connected to the input terminal 300 via the resistor 321, and the anode is grounded via the resistor 323. A resistance of the resistor 321 is less than that of the resistor 323, such that current through the voltage-stabilizing element 322 is limited.

The control circuit 330 includes a second transistor 331 and three resistors 332, 333, 334. The second transistor 331 is a p-channel metal oxide semiconductor (PMOS) transistor, and includes a gate (not labeled), a drain (not labeled), and a source (not labeled). The gate of the second transistor 331 is connected to the anode of the voltage-stabilizing element 322 via the resistor 332, the drain is connected to the input terminal 300 via the resistor 333, and the source is grounded. The resistor 334 is connected between the drain and the source of the second transistor 331. When no voltage is applied to the input terminal 300 of the over-voltage protection circuit 23, a parasitic capacitor between the drain and the source of the second transistor 331 discharges through the resistor 334.

The first transistor 340 is a PMOS transistor, and includes a gate (not labeled), a drain (not labeled), and a source (not labeled). The gate of the first transistor 340 is connected to the drain of the second transistor 331, the source of the first transistor 340 is connected to the input terminal 300, and the drain of the first transistor 340 is connected to the output terminal 350.

When the voltage applied to the input terminal 300 is less than about 5.5V, the dividing voltage on the resistor 312 is lower than about 2.5V, thus the reference voltage applied to the reference terminal of the voltage-stabilizing element 322 is lower than about 2.5V and the voltage-stabilizing element 322 is cut off, and no dividing voltage is generated on the resistor 323. The gate of the second transistor 331 is grounded via the resistors 332, 323, thus the second transistor 331 conducts due to the gate thereof at a low potential. The gate of the first transistor 340 is grounded via the second transistor 331, thus the first transistor 340 also conducts due to the gate thereof at a low potential. Therefore, a voltage signal applied to the input terminal 300 is output from the output terminal 350 via the first transistor 340.

When the voltage applied to the input terminal 300 exceeds or equals about 5.5V, the dividing voltage on the resistor 312 exceeds or equals about 2.5V, thus the reference voltage applied to the reference terminal of the voltage-stabilizing element 322 exceeds or equals about 2.5V and the voltage-stabilizing element 322 conducts, and a dividing voltage is generated on the resistor 323. The second transistor 331 is cut off when the gate thereof reaches a high potential. Current flows through the resistors 333, 334, and a dividing voltage is generated on the resistor 334, thus the first transistor 340 is also cut off due to the gate thereof reaching a high potential. Accordingly, electrical connection between the input terminal 300 and the output terminal 350 is cut off, and voltage applied to the input terminal 300 cannot be output from the output terminal 350 via the first transistor 340.

The over-voltage protection circuit 23 is connected between the power board circuit 21 and the panel circuit 24, when the voltage applied by the power board circuit 21 is too large or larger than the predetermined value, the over-voltage protection circuit 23 cuts off the electrical connection between the power board circuit 21 and the panel circuit 24. Therefore, the panel circuit 24 can be protected from over voltage. Furthermore, the over-voltage protection circuit 23 has simple structure, low cost, and is liable to be obtained.

Figure 3:
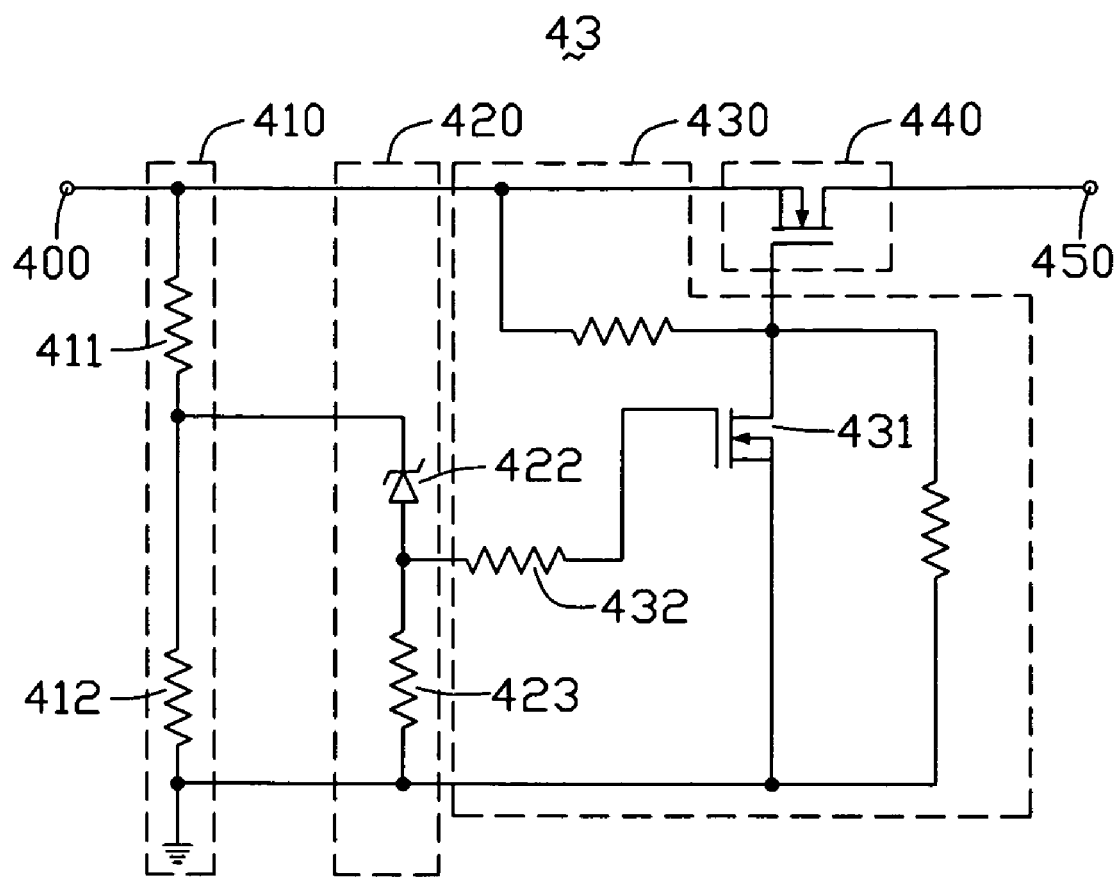
FIG. 3 is a circuit diagram of an over-voltage protection circuit for an LCD driving circuit of the present disclosure.

FIG. 3 is a circuit diagram of an over-voltage protection circuit 43 for an LCD driving circuit of the present disclosure. The driving circuit is not shown her for brevity. The disclosed over-voltage protection circuit 43 of the driving circuit includes a voltage-stabilizing circuit 420.

The voltage-stabilizing circuit 420 includes a voltage-stabilizing element 422 and a resistor 423. The voltage-stabilizing element 422 is a voltage-stabilizing diode, and includes an anode (not labeled) and a cathode (not labeled). The cathode of the voltage-stabilizing element 422 is connected between two resistors 411, 412 of a voltage-dividing circuit 410 of the over-voltage protection circuit 43, and the anode of the voltage-stabilizing element 422 is grounded via the resistor 423. A gate of a transistor 431 of a control circuit 430 of the over-voltage protection circuit 43 is connected to the anode of the voltage-stabilizing element 422. A conducting voltage of the voltage-stabilizing element 422 is about 2.5V, namely, the voltage-stabilizing element 422 conducts when a voltage provided to the cathode is about 2.5V or more than that to the anode. Accordingly, the voltage-stabilizing element 422 does not conduct when the voltage provided to the cathode is less than about 2.5V.

When a voltage applied to an input terminal 400 of the over-voltage protection circuit 43 is less than about 5.5V, a dividing voltage on the resistor 312 is lower than about 2.5V and the voltage-stabilizing element 422 is cut off, with no dividing voltage generated on the resistor 423. The gate of the transistor 431 is grounded via the resistors 432, 423, thus the transistor 431 conducts due to the gate thereof having a low potential. A transistor 440 of the over-voltage protection circuit 43 also conducts due to a gate thereof having a low potential. Accordingly, a voltage signal applied to the input terminal 400 is output from an output terminal 450 of the over-voltage protection circuit 43 via the transistor 440.

When voltage applied to the input terminal 400 exceeds or equals about 5.5V, the dividing voltage on the resistor 412 exceeds or equals about 2.5V, thus the voltage-stabilizing element 422 conducts, and a dividing voltage is generated on the resistor 423. The transistor 431 is cut off due to the gate thereof having a high potential. The transistor 440 is also cut off due to the gate thereof having a high potential. Therefore, an electrical connection between the input terminal 400 and the output terminal 450 is cut off. Over-voltage protection is thus achieved.

Alternatively, the predetermined value of the over-voltage protection circuit of this present disclosure needs not be limited to 5.5V, and can be changed by adjusting the proportion of resistances of the two resistors of the voltage-dividing circuit while the reference voltage does not need to be changed. That is, the over-voltage protection circuit as disclosed can protect a variety of electronic devices having different input voltages. Furthermore, the transistors of the over-voltage protection circuit of this present disclosure can be PNP bipolar junction transistors.

It is to be understood, however, that even though numerous characteristics and advantages of preferred and exemplary embodiments have been set out in the foregoing description, together with details of the structures and functions of the embodiments, the disclosure is illustrative only; and that changes may be made in detail, especially in matters of shape, size, and arrangement of parts within the principles of the present invention to the full extent indicated by the broad general meaning of the terms in which the appended claims are expressed.

What is claimed is:

1. An over-voltage protection circuit, comprising:
an input terminal to receive an input voltage;
a voltage-dividing circuit comprising a first resistor and a second resistor connected in series between the input terminal and ground;
a voltage-stabilizing circuit comprising a voltage-stabilizing element;
a control circuit comprising a transistor, a third resistor, a fourth resistor, and a fifth resistor, the transistor comprising a gate connected to the voltage-stabilizing circuit via the third resistor, a drain connected to the input terminal via the fourth resistor, and a source grounded, and the fifth resistor connected between the drain and the source of the transistor;
a switching element; and
an output terminal;
wherein the voltage-dividing circuit is operable to provide a reference voltage according to the input voltage to the voltage-stabilizing circuit, the voltage-stabilizing circuit is operable to determine whether the voltage-stabilizing element conducts according to the reference voltage, and the control circuit is operable to control the switching element to switch on or off according to a conductive state of the voltage-stabilizing element to determine whether the output terminal outputs an output voltage, when the voltage-stabilizing element conducts, the switching element switches off causing the output terminal not to output the output voltage, when the voltage-stabilizing element is cut off, the switching element switches on causing the output terminal to output the output voltage via the switching element.

2. The over-voltage protection circuit of claim 1, wherein the transistor is a p-channel metal oxide semiconductor transistor.

3. The over-voltage protection circuit of claim 1, wherein the switching element comprises a gate connected to the drain of the transistor of the control circuit, a source connected to the input terminal, and a drain connected to the output terminal.

4. The over-voltage protection circuit of claim 3, wherein the switching element is a p-channel metal oxide semiconductor transistor.

5. The over-voltage protection circuit of claim 1, wherein the voltage-stabilizing circuit further comprises a sixth resistor and a seventh resistor, the sixth resistor connected between the voltage-stabilizing element and ground, and the seventh resistor connected between the input terminal and the voltage-stabilizing element.

6. The over-voltage protection circuit of claim 5, wherein the voltage-stabilizing element comprises an anode connected to the third and the sixth resistors, a cathode connected to the seventh resistor, and a reference terminal connected between the first and the second resistors.

7. The over-voltage protection circuit of claim 6, wherein the voltage-stabilizing element is a voltage-stabilizing diode.

8. The over-voltage protection circuit of claim 1, wherein the voltage-stabilizing circuit further comprises a sixth resistor connected between the voltage-stabilizing element and ground.

9. The over-voltage protection circuit of claim 8, wherein the voltage-stabilizing element comprises an anode connected to the third and the sixth resistors, and a cathode connected between the first and the second resistors.

10. The over-voltage protection circuit of claim 9, wherein the voltage-stabilizing element is a voltage-stabilizing diode.

11. A liquid crystal display (LCD) driving circuit, comprising:
a power board circuit;
a panel circuit; and
an over-voltage protection circuit connected between the power board circuit and the panel circuit;
wherein the over-voltage protection circuit comprises an input terminal to receive an input voltage provided by the power board circuit, a voltage-dividing circuit comprising a first resistor and a second resistor connected in series between the input terminal and ground, a voltage-stabilizing circuit comprising a voltage-stabilizing element, a control circuit, a switching element, and an output terminal, the control circuit comprising a transistor, a third resistor, a fourth resistor, and a fifth resistor, the transistor comprising a gate connected to the voltage-stabilizing circuit via the third resistor, a drain connected to the input terminal via the fourth resistor, and a source grounded, and the fifth resistor connected between the drain and the source of the transistor, the voltage-dividing circuit providing a reference voltage according to the input voltage to the voltage-stabilizing circuit, the voltage-stabilizing circuit determining whether the voltage-stabilizing element conducts according to the reference voltage, and the control circuit controlling the switching element to switch on or off according to a conductive state of the voltage-stabilizing element to determine whether the output terminal outputs an operating voltage to the panel circuit, when the voltage-stabilizing element conducts, the switching element switches off causing the output terminal not to output the output voltage, when the voltage-stabilizing element is cut off, the switching element switches on causing the output terminal to output the output voltage via the switching element.

12. The LCD driving circuit of claim 11, wherein a proportion of resistances of the first and the second resistors is 6:5.

13. The LCD driving circuit of claim 11, wherein the switching element comprises a gate connected to the drain of the transistor of the control circuit, a source connected to the input terminal, and a drain connected to the output terminal.

14. The LCD driving circuit of claim 11, wherein the voltage-stabilizing circuit further comprises a sixth resistor and a seventh resistor, and the voltage-stabilizing element comprises an anode connected to the third resistor and grounded via the sixth resistor, a cathode connected to the input terminal via the seventh resistor, and a reference terminal connected between the first and the second resistors.

15. The LCD driving circuit of claim 11, wherein the voltage-stabilizing circuit further comprises a sixth resistor, and the voltage-stabilizing element comprises an anode connected to the third resistor and grounded via the sixth resistor, and a cathode connected between the first and the second resistors.

16. The LCD driving circuit of claim 14, wherein the transistor and the switching element are p-channel metal oxide semiconductor transistors.

17. The LCD driving circuit of claim 16, wherein the voltage-stabilizing element is a voltage-stabilizing diode.

18. The LCD driving circuit of claim 15, wherein the transistor and the switching element are p-channel metal oxide semiconductor transistors.

19. The LCD driving circuit of claim 18, wherein the voltage-stabilizing element is a voltage-stabilizing diode.

* * * * *